(12) United States Patent
Rasek et al.

(10) Patent No.: US 11,251,693 B2
(45) Date of Patent: Feb. 15, 2022

(54) ELECTRICAL FILTER DEVICE FOR FILTERING A COMMON-MODE INTERFERENCE BETWEEN A CURRENT SOURCE AND A LOAD

(71) Applicant: Robert Bosch GmbH, Stuttgart (DE)

(72) Inventors: Guido Albert Rasek, Forchheim (DE); Illia Manushyn, Marbach Am Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/253,782

(22) PCT Filed: Jun. 13, 2019

(86) PCT No.: PCT/EP2019/065509
§ 371 (c)(1),
(2) Date: Dec. 18, 2020

(87) PCT Pub. No.: WO2019/243156
PCT Pub. Date: Dec. 26, 2019

(65) Prior Publication Data
US 2021/0273550 A1    Sep. 2, 2021

(30) Foreign Application Priority Data

Jun. 18, 2018  (DE) .................... 10 2018 209 740.2

(51) Int. Cl.
*H02M 1/12* (2006.01)
*H03H 7/09* (2006.01)
(52) U.S. Cl.
CPC .............. *H02M 1/123* (2021.05); *H03H 7/09* (2013.01)

(58) Field of Classification Search
CPC ................................. H02M 1/123; H03H 7/09
USPC ......................................................... 327/552
See application file for complete search history.

(56) References Cited

U.S. PATENT DOCUMENTS

| 2006/0220972 A1* | 10/2006 | Saitoh | H03H 7/427 343/722 |
| 2010/0182100 A1* | 7/2010 | Tucker | H02M 1/12 333/181 |

OTHER PUBLICATIONS

Translation of International Search Report for Application No. PCT/EP2019/065509 dated Sep. 24, 2019 (2 pages).
Heldwein et al., "Impact of EMC Filters on the Power Density of Modern Three-Phase PWM Converters", IEEE Transactions on Power Electronics, vol. 24, No. 6, 2009, pp. 1577-1588.

(Continued)

*Primary Examiner* — Tomi Skibinski
(74) *Attorney, Agent, or Firm* — Michael Best & Friedrich LLP (57) ABSTRACT

The present invention provides an electrical filter device (1) for filtering a common-mode interference between a current source and a load, comprising:—a signal input (E), which comprises at least one first terminal (E1) and can be connected to the current source; —a signal output (A), which can be connected to the load; —a main stage (H0), having a first main inductor (2a), which comprises a coil with a first core (3), the first main inductor (2a) being connected to the first terminal (E1); and—an auxiliary stage (H1), having at least one first anti-interference capacitor (C1) and one first auxiliary inductor (4), the first auxiliary inductor (4) being connected between the first terminal (E1) and the first anti-interference capacitor (C1), the first auxiliary inductor (4) being inductively coupled to the first main inductor (2a).

10 Claims, 3 Drawing Sheets

(56) References Cited

OTHER PUBLICATIONS

Jettanasen, "Modeling and Optimizing A Passive EMI Filter to Attenuate Common-Mode Currents at High Frequency in a Three Phase Adjustable-Speed AC Motor Drive", International Journal of Innovative Computing, Information, and Control, vol. 8, No. 10(A), 2012, pp. 6629-6642.

Fang Luo et al., "Analysis of CM Volt-Second Influence on CM Inductor Saturation and Design for Input EMI Filters in Three-Phase DC-Fed Motor Drive Systems", IEEE Trans Power Electron., vol. 25, No. 7, 2010, pp. 1905-1914.

* cited by examiner

ELECTRICAL FILTER DEVICE FOR FILTERING A COMMON-MODE INTERFERENCE BETWEEN A CURRENT SOURCE AND A LOAD

BACKGROUND OF THE INVENTION

The present invention relates to an electrical filter device for filtering a common-mode interference between a current source and a load.

In the automotive industry, emitted common-mode interference spectra for a pulse-width-modulation inverter (PWMI, for example in the medium-wave range) are reduced (filtered) by common-mode chokes or Y capacitors, passive EMC (electromagnetic compatibility) filters (for example with a different number of stages), by optimized design of motor and cable capacitances, or by special PWM (pulse-width modulation) methods for minimizing common-mode interference. Typical filter topologies such as LC, CLC or LCL generally have insertion losses which, depending on the number of stages, have an edge steepness of up to 40 dB or up to 60 dB per frequency decade. In order to achieve a steeper and/or higher insertion loss, either the nominal component part values of the filter components would need to be increased or a plurality of filter stages would need to be used.

The document M. L. Heldwein and J. W. Kolar, "Impact of EMC Filters on the Power Density of Modern Three-Phase PWM Converters" IEEE Trans. Power Electron., vol. 24, no. 6, pp. 1577-1588, 2009, the document C. Jettanasen, "Modelling and optimizing a passive EMI filter to attenuate common mode currents at high frequency in a three-phase adjustable speed ac mode drive", 2011, and the document Fang Luo et al., "Analysis of CM Volt-Second Influence on CM Inductor Saturation and Design for Input EMI Filters in Three-Phase DC-Fed Motor Drive Systems" IEEE Trans. Power Electron., vol. 25, no. 7, pp. 1905-1914, 2010 describe principles for improving insertion losses, in particular relating to high-frequency components of an EMC filter in order to influence there interference spectra of high-frequency components of the EMC filter. In order to improve an insertion loss at low frequencies, the use of inductive components with an increased inductance and/or enlarged capacitors with a higher capacitance or the additional connection of further filter stages in series are described.

SUMMARY OF THE INVENTION

The present invention provides an electrical filter device for filtering a common-mode interference between a current source and a load and a use of an electrical filter device.

The concept on which the present invention is based consists in specifying an electrical filter device which is capable of filtering common-mode interference between a current source and a load in an advantageous manner. Owing to increasing miniaturization and increasing complexity of electronics, mutual interfering influences between instrumentation and control and power systems are becoming more present, wherein each electrical device can play the role of an interference sink or interference source for other electrical devices. By means of EMC matching, the interfering influences can advantageously be restricted to a tolerable degree, with the result that sufficient functioning of the electrical devices is ensured.

In accordance with the invention, the electrical filter device for filtering a common-mode interference between a current source and a load comprises a signal input, which comprises at least one first terminal and is connectable to the current source, a signal output, which is connectable to the load, a main stage having a first main inductance, which comprises a coil having a first core, wherein the first main inductance is connected to the first terminal, and an auxiliary stage having at least one first interference suppression capacitor and one first auxiliary inductance, wherein the first auxiliary inductance is connected between the first terminal and the first interference suppression capacitor, wherein the first auxiliary inductance is inductively coupled to the first main inductance.

The common-mode interference can also be triggered by a further interference source and advantageously filtered. The current source can comprise a DC source.

The first auxiliary inductance can advantageously be connected in series, in any desired order, with the signal input and the first interference suppression capacitor, wherein the first auxiliary inductance is inductively coupled to the first main inductance.

The signal input comprises at least one terminal, but can advantageously also comprise a plurality of terminals, as a result of which further input signals can be capable of being applied to the main and/or auxiliary inductance(s).

The current source can advantageously comprise at least one battery, for example an HV battery for operating a power-electronics device or an electric motor, or any desired energy storage device, in which a low-frequency interference (frequencies in the range up to a few hundred MHz) between the load and the current source can be influenced by means of a filter device. The principle is advantageously applicable to AC/DC, AC/AC and three-phase devices, even in industry, aeronautics and in the transport sector. The power-electronics device may be, for example, an inverter, and the load may be, for example, an electric machine (for example for the automotive industry).

The main stage of the filter device can advantageously be matched to the frequencies to be filtered by selection of the characteristic variables of the coil (turns number, material, inductance) and/or the first core (permeability owing to selection of materials).

The first main inductance advantageously comprises, for the filtering effect, a current-compensated choke (CMC, common-mode choke), by means of which it is possible to achieve a reduction in an interference signal between the DC source and the load. The current-compensated choke can comprise two inner conductors. The current-compensated choke advantageously has, in the case of two inner conductors, in addition in each case two coils on the same first core which have been wound in the same direction around the first core, for example a toroidal core, in the case of which the two coils do not come into direct physical contact with one another, however. The first core advantageously comprises a magnetic material which has good properties in respect of the effect of permeability even at high frequencies. This is advantageously also applicable for a higher number of conductors with a correspondingly higher number of coils.

In this way, common-mode interference suppression between the current source and the load can be achieved by virtue of the first main inductance.

The inductive coupling between the first auxiliary inductance and the first main inductance is advantageously provided by virtue of the fact that the first auxiliary inductance is arranged in such a way that it is subjected to a magnetic field of the first main inductance, wherein the first auxiliary inductance and the first interference suppression capacitor are designed in such a way that a frequency of the interference signal can cause the auxiliary stage, in particular the first interference suppression capacitor and the first auxiliary inductance, to oscillate. The first auxiliary inductance and the first interference suppression capacitor are advantageously connected in series with one another.

Coupling of the interference suppression capacitor to the first auxiliary inductance advantageously results in an improvement in the filtering effect of the main stage. By virtue of this improvement, it is advantageously possible to achieve similar or better insertion losses as a result of the electrical filter device than can be achieved, in a known manner, in the case of filters (usually without auxiliary inductances) with simply an increase in the permeability of the core, simply an increase in capacitances of the main capacitors or additional connection of further filter components. The first auxiliary inductance is advantageously connected to a first terminal of the signal input and to a ground potential.

In accordance with a preferred embodiment of the electrical filter device, the first auxiliary inductance comprises precisely one winding.

In accordance with a preferred embodiment of the electrical filter device, the first auxiliary inductance comprises a coil, which has been wound onto the first core.

In accordance with a preferred embodiment of the electrical filter device, the first interference suppression capacitor is connected to a ground potential and forms, with the first auxiliary inductance, a series resonance with the first main inductance.

This advantageously results in the interchangeability, in series, of both interference suppression capacitors with the two auxiliary inductances.

The coil of the first auxiliary inductance has advantageously been wound onto the first core in the same direction as the coil of the first main inductance. By virtue of the fact that the advantageously one winding of the first auxiliary inductance is connected to the first interference suppression capacitor and by virtue of the inductive coupling to the first main inductance, an improved insertion loss can be achieved for interference frequencies (for example in the range of up to a few hundred MHz) by virtue of the fact that the resonance effect with the first auxiliary inductance couples to the oscillatory behavior of the first main inductance, in particular as a series resonance with respect to one another. The resonance behavior of the first auxiliary inductance can advantageously be matched corresponding to desired presets for the filtering effect by virtue of the number of windings of the first auxiliary inductance, by virtue of the permeability of the first core, and by virtue of the size of the capacitance of the first interference suppression capacitor. The inductive coupling between the first auxiliary inductance and the first main inductance is advantageously complete, in particular when it is large, preferably as close to 1.0 as possible. The series resonance advantageously increases the value of the insertion loss without the need for using additional filter stages. The first interference suppression capacitor advantageously has a capacitance which is lower than the capacitance of the main capacitor. As a result, in order to achieve a desired insertion loss of the filter device in comparison with an embodiment without an auxiliary inductance, it is advantageously possible to connect an interference suppression capacitor having lower capacitance values in the filter device than would be the case for the main capacitor(s), which particularly applies in the case of multi-stage filter devices having Y capacitors but without auxiliary inductances (series resonance). This reduces costs and additional complexity in the case of multi-stage and larger component parts and increases the choice of available and combinable components. In addition, a lower capacitance between the (supply) line and the housing advantageously results.

In accordance with a preferred embodiment of the electrical filter device, the auxiliary stage comprises at least one second interference suppression capacitor and at least one second auxiliary inductance, wherein the signal input comprises a second terminal, and the second auxiliary inductance is connected between the second terminal of the signal input and the second interference suppression capacitor, and wherein the second auxiliary inductance is inductively coupled to the first main inductance.

The second auxiliary inductance advantageously comprises a coil, which is arranged in the filter device in such a way that it is subjected to a magnetic field of the first main inductance in such a way that the second auxiliary inductance and the second interference suppression capacitor can be caused to oscillate by the magnetic field of the first main inductance (resonance). In this case, the second auxiliary inductance and the second interference suppression capacitor are advantageously designed in such a way that a frequency of the interference signal can cause the auxiliary stage, in particular the second interference suppression capacitor and the second auxiliary inductance, to oscillate (resonance). The second auxiliary inductance is advantageously positioned in parallel with the signal input with respect to the first auxiliary inductance and forms a dedicated switching path from the signal input to the ground potential, wherein the second auxiliary inductance is connected in series with the second interference suppression capacitor.

In accordance with a preferred embodiment of the electrical filter device, the second auxiliary inductance comprises a coil, which has been wound onto the first core.

In accordance with a preferred embodiment of the electrical filter device, the second auxiliary inductance comprises precisely one winding.

In accordance with a preferred embodiment of the electrical filter device, the first or the second interference suppression capacitor is connected to a ground potential and forms a series resonance with the first main inductance.

The coil of the second auxiliary inductance has advantageously been wound onto the first core in the same direction as the coil of the first auxiliary inductance and as the coil of the first main inductance. By virtue of the interconnection of the advantageously one winding of the second auxiliary inductance and the second interference suppression capacitor and the inductive coupling to the first main inductance and advantageously to the first auxiliary inductance, an insertion loss can be improved further for interference frequencies (for example in the range up to a few hundred MHz) than is in any case already possible with only one auxiliary inductance. The resonance behavior of the first auxiliary inductance, the first main inductance and the second auxiliary inductance can advantageously be matched corresponding to desired presets for the filtering effect by virtue of the number of windings of the auxiliary inductances, by virtue of the permeability of the first core, and by virtue of the size of the capacitance of the first and the second interference suppression capacitors. The inductive coupling between the first and second auxiliary inductances and the first main inductance is advantageously complete, in particular when it is large, preferably close to 1.0. The second interference suppression capacitor advantageously has a capacitance which is lower than the capacitance of the main capacitor, as a result of which, advantageously, a loss value with slightly capacitive elements can be achieved than with main capacitors in similarly acting filter circuits which only comprise main stages. This is advantageous since the built-in capacitance of the Y capacitors can be limited.

The number of windings of the first and the second auxiliary inductances can advantageously be matched for fine tuning of the filtering effect. The first and the second interference suppression capacitors are advantageously both connected in each case to Y capacitors (Cy topology). However, it is also possible for the two interference suppression capacitors to be connected to the respective auxiliary inductance using other topologies or to be supplemented by such other topologies, for example LCL, CLC or other topologies. Furthermore, it is possible to extend the filter device by further auxiliary inductances having further interference suppression capacitors and to inductively couple to the first and/or second main inductance(s).

The improvement of the insertion loss in the already mentioned dimension can advantageously also be achieved without any increased complexity, after which the components such as interference suppression capacitors and main capacitors, dimension and number of windings of the coils or the material of the core would need to be matched to one another with a high degree of precision since, in the case of a described coupling of auxiliary inductances to a main inductance, any parameters of components can advantageously be used without any extraordinary tolerance demand. In other words, tolerances and manufacturing inaccuracies advantageously only have minimal effects on the improved action of the insertion loss owing to the principle according to the invention.

The concept illustrated comprising one or more auxiliary stages is advantageously also connectable to and extendable by further filter stages.

In accordance with a preferred embodiment of the electrical filter device, the first and/or the second interference suppression capacitor(s) comprise(s) a Y capacitor.

As an alternative to this, the first and the second interference suppression capacitors can, however, also have a different design and be supplemented by additional stages (damping resistors and/or further inductances or other component parts). The capacitances and the mode of interconnection of the capacitors can be matched in order to achieve advantageously an optimum network property when installing the filter device in a network. For example, it is also possible to connect two auxiliary inductances and only one interference suppression capacitor or more than two interference suppression capacitors. The frequency range to be filtered can in principle be determined by the selection of component part values and the design of the filter device, and the main and auxiliary inductances as well as the capacitors and cores can be matched thereto during design.

The filtering effect of the filter device advantageously serves the purpose of, for example, EMC interference suppression at a frequency of from 100 kHz to 2 MHz and achieves an insertion loss of up to 70 dB per frequency decade for this communications band (MW). Other frequency bands are likewise tunable.

In accordance with a preferred embodiment of the electrical filter device, the first and/or the second interference suppression capacitor(s) is or are extendable by any desired R, RL, RLC network.

In accordance with the invention, the electrical filter device is used in a drive system, in an electric and/or hybrid vehicle or in an industrial application.

The described electrical filter device can advantageously be used for any drive systems comprising a pulse-width-modulation inverter (PWMI), in which motors are supplied using inverters, and in which motor-side interference is intended to be reduced by power electronics circuits. The electrical filter device can advantageously be used in the electric and hybrid vehicle sector (for all voltages), in inverter-fed industrial drives or in industrial inverters (for example in solar power installations, elevators, railways, aircraft or the like).

Further features and advantages of embodiments of the invention result from the description below with reference to the attached drawings.

BRIEF DESCRIPTION OF THE DRAWINGS

The present invention will be explained in more detail below with reference to the exemplary embodiments specified in the schematic figures of the drawings, in which.

Identical reference symbols denote identical or functionally identical elements in the figures.

DETAILED DESCRIPTION

Figure 1:
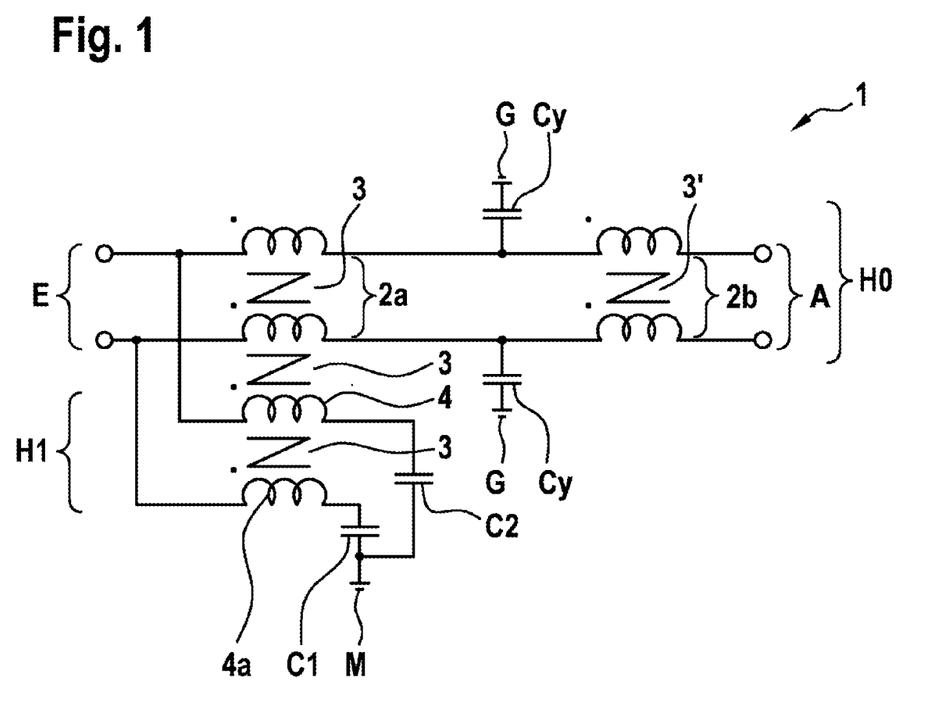
FIG. 1 shows an electrical circuit diagram for a filter device in accordance with one exemplary embodiment of the present invention using the example of a DC application.

FIG. 1 shows an electrical circuit diagram for a filter device in accordance with one exemplary embodiment of the present invention.

The electrical filter device 1 has a signal input E and a signal output A, each advantageously having two contacts, wherein a current source is connectable to the signal input E, and a load, for example an inverter having an electric machine, is connectable to the signal output A. The signal input in this case has a first terminal E1 and advantageously a second terminal E2. The filter device 1 comprises a main stage H0, which comprises a first main inductance 2a at the signal input E, which first main inductance is connected to advantageously the two terminals E1 and E2 of the signal input E, and can advantageously have a second main inductance 2b at the signal output A. The first main inductance 2a can also comprise a plurality of main inductances, which can each be connected to a terminal at the output or input. The first main inductance 2a advantageously has two coils on a first core 3, which coils have been wound onto the first core 3 (Z symbol) in the same direction (indicated by the point above the winding) but separately from one another. The turns number of the two coils can advantageously be the same. The two coils running in the same direction on the first core 3 advantageously form a current-compensated choke, advantageously a common-mode choke.

Furthermore, the filter device can comprise a second main inductance 2b, but this is not absolutely necessary. This second main inductance is advantageously also a current-compensated choke having a second core 3', which can have a similar or identical permeability (inductance) to the first core 3 in order to have a similar or identical oscillatory behavior in the filter device. The two main inductances can, with two main capacitors Cy, advantageously represent an LCL topology of the filter device. The two main capacitors Cy advantageously each comprise one or more Y capacitors and can be connected between the first and the second main inductances 2a and 2b.

At the first main inductance 2a, furthermore, a first auxiliary inductance 4 and advantageously a second auxiliary inductance 4a are inductively coupled to the first main inductance 2a, wherein the first auxiliary inductance 4 and the second auxiliary inductance 4a can each have been wound onto the first core 3 (Z symbol), in each case as a coil having advantageously one winding, in the same direction as the advantageously two coils of the first main inductance 2a.

A first interference suppression capacitor C1, which can be connected to a ground potential M on advantageously one side, remote from the signal input, of the first auxiliary inductance 4, is applied to the first auxiliary inductance 4. A second interference suppression capacitor C2, which is connected to a ground potential M on the other side, can be applied to the second auxiliary inductance 4a, wherein the first and the second interference suppression capacitors can advantageously both be connected in each case using a Cy topology. The two auxiliary inductances and the interference suppression capacitors together form the auxiliary stage H1. The two interference suppression capacitors can advantageously also be supplemented by further interference suppression capacitors or other components and can be different from one another. As a result, advantageously an individual fine tuning of the filtering effect can be achieved in order to achieve an optimum network behavior. The first auxiliary inductance 4 is advantageously connected to the first terminal E1 of the signal input E, and the second auxiliary inductance 4a is advantageously connected to the second terminal E2 of the signal input E.

The interconnection of auxiliary inductances and interference suppression capacitors and the series coupling can be simple to construct using existing component parts (therefore no increased complexity involved for the acquisition of component parts) and uses the used component parts (the size thereof) more efficiently in order to achieve high and/or predetermined losses than existing filter devices without auxiliary stages.

Figure 2:
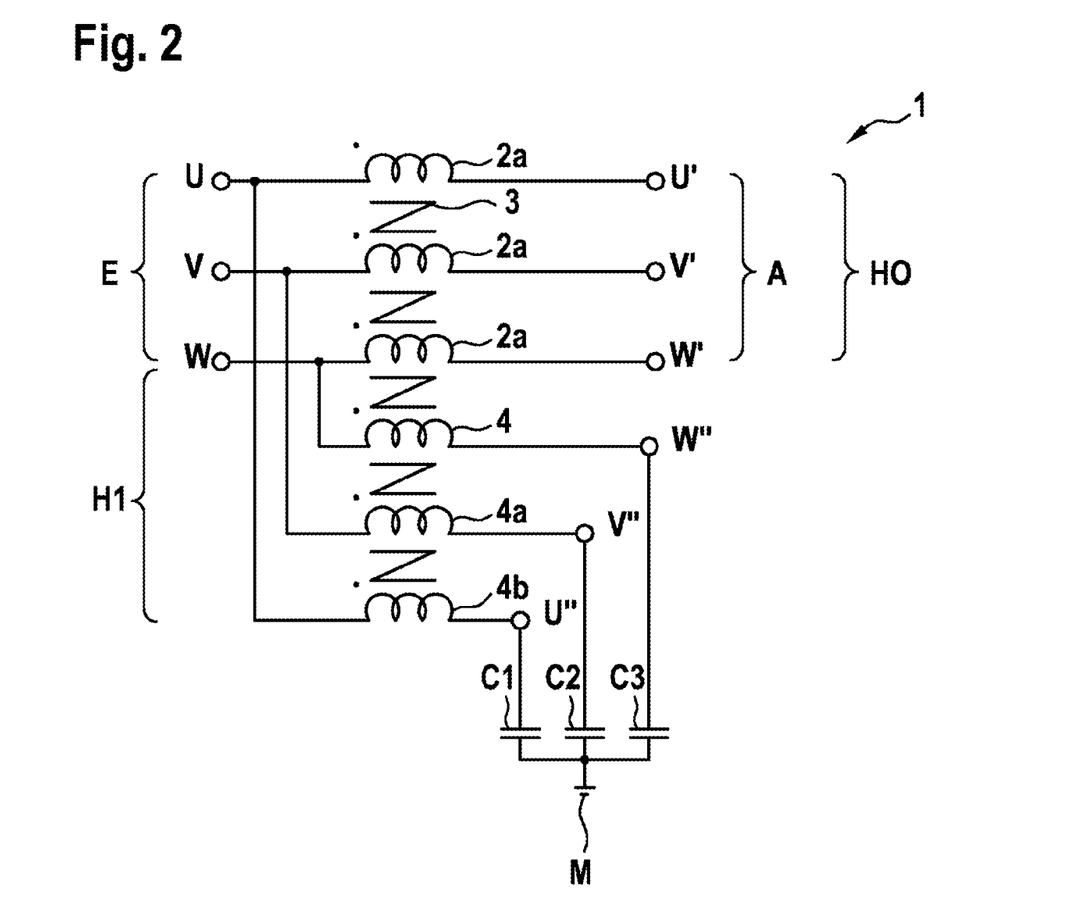
FIG. 2 shows an electrical circuit diagram for a filter device in accordance with one exemplary embodiment of the present invention using the example of an AC three-phase application.

FIG. 2 shows an electrical circuit diagram for a filter device in accordance with one exemplary embodiment of the present invention using the example of an AC three-phase application.

The filter device 1 shown in FIG. 2 differs from the filter device shown in FIG. 1 in that the filter device shown in FIG. 2 comprises a main stage H0 having only one first main inductance 2a at the signal input E, which first main inductance can comprise three terminals, can be drivable from the signal input E by three signals U, V and W (voltages), and can be likewise connected to the signal output A and can output three output signals U', V' and W' to three output terminals (filtered). This filter stage is likewise extendable by further filter stages on both sides. The first main inductance 2a in this case comprises three dedicated arrangements of turns, which have advantageously all been arranged (wound) on (onto) the first core 3. The filter device 1 comprises an auxiliary stage H1 and, for each of the three input signals U, V and W, an advantageously dedicated auxiliary inductance 4, 4a and 4b, in other words a first auxiliary inductance 4, a second auxiliary inductance 4a and a third auxiliary inductance 4b, which can be connected to a first interference suppression capacitor C1, a second interference suppression capacitor C2 and a third interference suppression capacitor C3 and to the ground potential M. Advantageously in each case one potential U''', V''' and W''' is present at the nodes between one of the auxiliary inductances and the associated interference suppression capacitor. All three auxiliary inductances have advantageously likewise been arranged (wound) on (onto) the first core 3.

Figure 3:
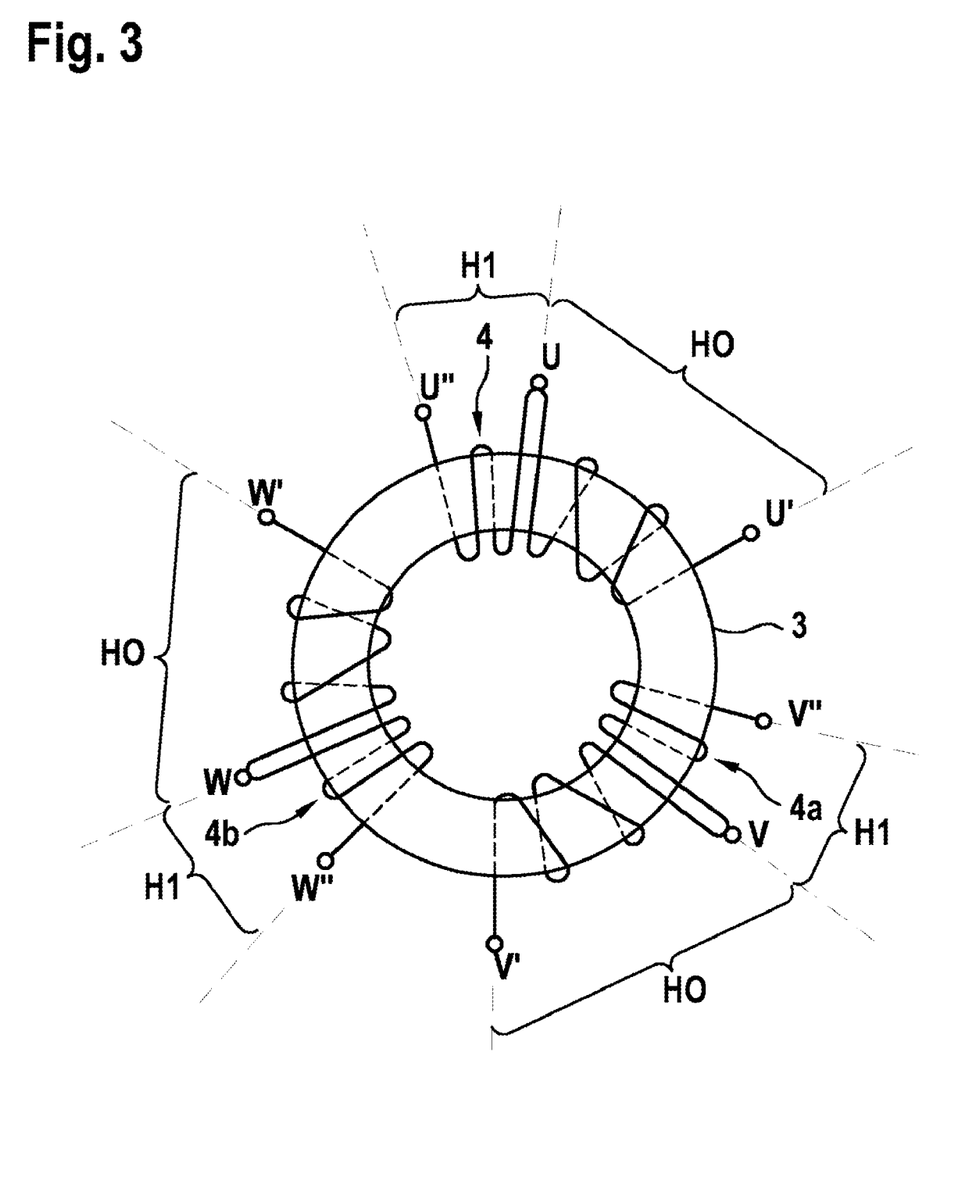
FIG. 3 shows a schematic illustration of a filter device shown in FIG. 2.

FIG. 3 shows a schematic illustration of a filter device shown in FIG. 2.

The schematic view shows a toroidal core as the first core 3, onto which the main inductances and the associated auxiliary inductances 4, 4a and 4b can have been wound. From the contact for the voltage U there is therefore a path via the main inductance H1 to a contact for the output signal U' and at the same time via the first auxiliary inductance 4 to the contact for the signal U'''. Likewise for the second and third signals V and W to V', W' and V''' and W'''. A topology of interference suppression capacitors (not shown) is connectable to the contacts U''', V''' and W'''.

Although the present invention has been described completely above with reference to the preferred exemplary embodiment, it is not restricted thereto but can be modified in a variety of ways and can be extended by standard filters both on the input and output sides.

FIG. 2 shows an electrical circuit diagram for a filter device in accordance with one exemplary embodiment of the present invention using the example of an AC 3-phase application; and FIG. 3 shows a schematic illustration of a filter device shown in FIG. 2.

Identical reference symbols denote identical or functionally identical elements in the figures.

FIG. 1 shows an electrical circuit diagram for a filter device in accordance with one exemplary embodiment of the present invention.

The electrical filter device 1 has a signal input E and a signal output A advantageously comprising in each case to contacts, wherein a current source is connectable to the signal input E and a load, for example an inverter comprising an electric machine, is connectable to the signal output A. In this case, the signal input has a first terminal E1 and advantageously a second terminal E2. The filter device 1 comprises a main stage H0, which comprises a first main inductance to locate a at the signal input E, which first main inductance is connected advantageously to both terminals E1 and E2 of the signal input E, and can advantageously have a second main inductance B at the signal output A. The first main inductance 2a can also comprise a plurality of main inductances, which can each be connected to a terminal at the output or input. The first main inductance to a advantageously has two coils on a first core 3, which coils have been wound in the same direction (indicated by the point above the winding) but separately from one another on the first core 3 (Z symbol). The number of turns of the two coils can advantageously be the same. The two coils running in the same direction on the first core 3 advantageously form a current-compensated choke, advantageously a common-mode choke.

Furthermore, the filter device can comprise a second main inductance to be, but this is not absolutely necessary. Said second main inductance may advantageously also be a current-compensated choke comprising a second core 3', which can have a similar or identical permeability (inductance) to the first core 3 in order to have a similar or identical oscillatory behavior in the filter device. The second main inductances can, with two main capacitors Cy, advantageously represent an LCL topology of the filter device. The two main capacitors Cy advantageously each comprise one or more Y capacitors and can be connected between the first and the second main inductances 2a and 2b.

Furthermore, at the first main inductance 2a, a first auxiliary inductance 4 and advantageously a second auxiliary inductance 4a are coupled inductively to the first main inductance 2a, wherein the first auxiliary inductance 4 and the second auxiliary inductance 4a can each be wound as a coil with advantageously one winding on the first core 3 (Z symbol) in the same direction as the advantageously to coils of the first main inductance 2a.

A first interference suppression capacitor C1 is applied to the first auxiliary inductance 4, said first interference suppression capacitor being capable of being connected to a ground potential M on advantageously one side, remote from the signal input, of the first auxiliary inductance 4. A second interference suppression capacitor C2 can be applied to the second auxiliary inductance 4a, said second interference suppression capacitor being connected to a ground potential M on the other side, wherein the first and the second interference suppression capacitors can advantageously both be connected in each case using a Cy topology. The two auxiliary inductances and the interference suppression capacitors together form the auxiliary stage H1. The two interference suppression capacitors can advantageously also be supplemented by further interference suppression capacitors or other components and can be different from one another. As a result, advantageously individual fine tuning of the filter effect can be achieved in order to achieve optimum grid behavior. The first auxiliary inductance 4 is advantageously connected to the first terminal E1 of the signal input E, and the second auxiliary inductance 4a is advantageously connected to the second terminal E2 of the signal input E.

The connection of auxiliary inductances to interference suppression capacitors and the serial coupling is simple to construct with existing component parts (therefore no increased complexity for the acquisition of component parts) and uses the used component parts (their size) more efficiently in order to achieve high and/or predetermined damping levels than is possible with conventional filter devices without auxiliary stages.

FIG. 2 shows an electrical circuit diagram for a filter device in accordance with one exemplary bottom end of the present invention using the example of an AC 3-phase application.

The filter device 1 shown in FIG. 2 differs from the filter device shown in FIG. 1 in that the filter device shown in FIG. 2 comprises a main stage H0 comprising only 1 first main inductance 2a at the signal input E, which can comprise 3 terminals, which can be drivable from the signal input E by 3 signals U, V and W (voltages), and which can be connected likewise to the signal output A and can output 3 output signals U', V' and W' to three output terminals (filtered). This filter stage is likewise extendable by further filter stages on both sides. The first main inductance 2a in this case comprises 3 dedicated arrangements of turns, which advantageously are all arranged (wound) on the first core 3. The filter device 1 comprises an auxiliary stage HI and, for each of the 3 input signals U, V and W, and advantageously dedicated auxiliary inductance 4, 4a and 4b, in other words a first auxiliary inductance 4, a second auxiliary inductance 4a and a third auxiliary inductance 4b, which can be connected to a first interference suppression capacitor C1, a second interference suppression capacitor C2 and a third interference suppression capacitor C3 and to the ground potential M. Advantageously in each case one potential U", V" and W" is present at the nodes between 1 of the auxiliary inductances and the associated interference suppression capacitor. All 3 auxiliary inductances are advantageously likewise arranged (wound) on the first core.

FIG. 3 shows a schematic illustration of a filter device shown in FIG. 2.

The schematic view shows a toroidal core as the first core 3, onto which the main inductances and the associated auxiliary inductances 4, 4a and 4b can have been wound. From the contact for the voltage U there is therefore a path, via the main inductance H1, to a contact for the output signal U' and at the same time, via the first auxiliary inductance 4, to the contact for the signal U". Likewise for the second and third signals V and W to V', W' and V" and W". A topology of interference suppression capacitors is connectable to the contacts U", V" and W" (not shown).

Although the present invention has been described above completely with reference to the preferred exemplary embodiment, it is not restricted to this exemplary embodiment but can be modified in a variety of ways and can be extended by standard filters both on the input and the output side.

What is claimed is:

1. An electrical filter device (1) for filtering a common-mode interference between a current source and a load, the electrical filter device (1) comprising:
   a signal input (E), which comprises at least one first terminal (E1) and which is connectable to the current source,
   a signal output (A), which is connectable to the load,
   a main stage (H0) having a first main inductance (2a), which comprises a coil having a first core (3), wherein the first main inductance (2a) is connected to the first terminal (E1), and the main stage (HO) having a main capacitor (Cy) connected between the coil and the signal output (A) and to ground (G), and
   an auxiliary stage (H1) having at least one first interference suppression capacitor (C1) and one first auxiliary inductance (4) including precisely one winding, wherein the first auxiliary inductance (4) is connected between the first terminal (E1) and the first interference suppression capacitor (C1), wherein the first auxiliary inductance (4) is inductively coupled to the first main inductance (2a), and
   wherein the main stage (HO) includes a second main inductance (2b) at the signal output (A), and wherein the main capacitor (Cy) is connected between the coil of the first main inductance (2a) and a coil of the second main inductance (2b).

2. The electrical filter device (1) as claimed in claim 1, in which the first auxiliary inductance (4) comprises a coil, which has been wound onto the first core (3).

3. The electrical filter device (1) as claimed in claim 1, in which the first interference suppression capacitor (C1) is connected to a ground potential (M) and forms, with the first auxiliary inductance (4), a series resonance with the first main inductance (2a).

4. The electrical filter device (1) as claimed in claim 1, in which the auxiliary stage (H1) comprises at least one second interference suppression capacitor (C2) and at least one second auxiliary inductance (4a), wherein the signal input (E) comprises a second terminal (E2), and the second auxiliary inductance (4a) is connected between the second terminal (E2) of the signal input (E) and the second interference suppression capacitor (C2), and wherein the second auxiliary inductance (4a) is inductively coupled to the first main inductance (2a).

5. The electrical filter device (1) as claimed in claim 4, in which the second auxiliary inductance (4a) comprises a coil, which has been wound onto the first core (3).

6. The electrical filter device (1) as claimed in claim 4, in which the second auxiliary inductance (4a) comprises precisely one winding.

7. The electrical filter device (1) as claimed in claim 4, in which the first interference suppression capacitor (C1) or the second interference suppression capacitor (C2) is connected to a ground potential (M) and forms, with the second auxiliary inductance (4a), a series resonance with the first main inductance (2a).

8. The electrical filter device (1) as claimed in claim 1, in which the first and/or the second interference suppression capacitor(s) (C1, C2) comprise(s) a Y capacitor.

9. The electrical filter device (1) as claimed in claim 1, in which the first and/or the second interference suppression capacitor(s) (C1, C2) is or are extendable by any desired R, RL, RLC network.

10. A use of an electrical filter device (1) as claimed in claim 1 in a drive system, in an electric and/or hybrid vehicle.

\* \* \* \* \*